US009188655B2

United States Patent
Takeshima

(10) Patent No.: US 9,188,655 B2
(45) Date of Patent: Nov. 17, 2015

(54) MAGNETIC RESONANCE IMAGING APPARATUS AND IMAGE PROCESSING APPARATUS

(71) Applicant: Hidenori Takeshima, Kanagawa (JP)

(72) Inventor: Hidenori Takeshima, Kanagawa (JP)

(73) Assignees: KABUSHIKI KAISHA TOSHIBA, Minato-Ku, Tokyo (JP); TOSHIBA MEDICAL SYSTEMS CORPORATION, Otawara-Shi, Tochigi (JP)

( * ) Notice: Subject to any disclaimer, the term of this patent is extended or adjusted under 35 U.S.C. 154(b) by 528 days.

(21) Appl. No.: 13/671,748

(22) Filed: Nov. 8, 2012

(65) Prior Publication Data

US 2013/0285662 A1 Oct. 31, 2013

(30) Foreign Application Priority Data

Apr. 27, 2012 (JP) .................................. 2012-103918
Sep. 13, 2012 (JP) .................................. 2012-201752

(51) Int. Cl.
*G01V 3/00* (2006.01)
*G01R 33/54* (2006.01)
*G01R 33/34* (2006.01)
*G01R 33/56* (2006.01)
*G01R 33/561* (2006.01)
(Continued)

(52) U.S. Cl.
CPC .............. *G01R 33/543* (2013.01); *G01R 33/34* (2013.01); *G01R 33/5608* (2013.01); *G01R 33/5611* (2013.01); *G01R 33/5614* (2013.01); *G01R 33/5673* (2013.01); *G01R 33/56325* (2013.01); *G01R 33/56341* (2013.01)

(58) Field of Classification Search
CPC ...................................................... G01R 33/543
USPC ............................................................ 324/309
See application file for complete search history.

(56) References Cited

U.S. PATENT DOCUMENTS 7,688,068 B2 3/2010 Beatty
7,746,070 B2 6/2010 Park et al.
8,228,063 B2 * 7/2012 Kimura .......................... 324/309
(Continued)

FOREIGN PATENT DOCUMENTS

CN 101627910 A 1/2010
JP 2008-307357 12/2008

OTHER PUBLICATIONS

Office Action mailed Nov. 2, 2014, in CN 201210501983.8 with English translation.

(Continued)

*Primary Examiner* — Rodney Fuller
(74) *Attorney, Agent, or Firm* — Nixon & Vanderhye P.C.

(57) ABSTRACT

A magnetic resonance imaging apparatus includes: an arranging unit that arranges magnetic resonance signals acquired by implementing parallel imaging and correspond to a plurality of channels into a first region on a k-space so as to be positioned at first interval to generate first k-space data and into a second region larger than the first region so as to be positioned at second interval larger than the first interval to generate second k-space data; a generating unit that generates third k-space data at the first interval corresponding to each of the plurality of channels, based on the second k-space data; and a reconstructing unit that reconstructs a magnetic resonance image, based on the first k-space data, the third k-space data, and sensitivity distributions corresponding to the plurality of channels.

20 Claims, 8 Drawing Sheets

(51) Int. Cl.
   *G01R 33/563*   (2006.01)
   *G01R 33/567*   (2006.01)

(56) References Cited

U.S. PATENT DOCUMENTS

| | | | | |
|---|---|---|---|---|
| 8,577,443 | B2* | 11/2013 | Miyazaki | 600/413 |
| 2006/0208731 | A1* | 9/2006 | Wang et al. | 324/309 |
| 2010/0039110 | A1* | 2/2010 | Takahashi et al. | 324/310 |
| 2010/0171496 | A1 | 7/2010 | Park et al. | |
| 2011/0156704 | A1* | 6/2011 | Boernert et al. | 324/309 |
| 2013/0285655 | A1* | 10/2013 | Miyazaki et al. | 324/309 |
| 2015/0028872 | A1* | 1/2015 | Takeshima | 324/318 |

OTHER PUBLICATIONS

Pruessmann, K.P. et al., "SENSE: Sensitivity Encoding for Fast MRI," Magnetic Resonance in Medicine, 42: 952-962 (1999).

Griswold, M.A. et al., "Generalized Autocalibrating Partially Parallel Acquisitions (GRAPPA)," Magnetic Resonance in Medicine, 47: 1202-1210 (2002).

Tsao J. et al., "Unifying Linear Prior-Information-Driven Methods for Accelerated Image Acquisition," Magnetic Resonance in Medicine, 46: 652-660 (2001).

Tsao J. et al., "*k-t* BLAST and *k-t* SENSE : Dynamic MRI With High Frame Rate Exploiting Spatiotemporal Correlations," Magnetic Resonance in Medicine, 50: 1031-1042 (2003).

\* cited by examiner

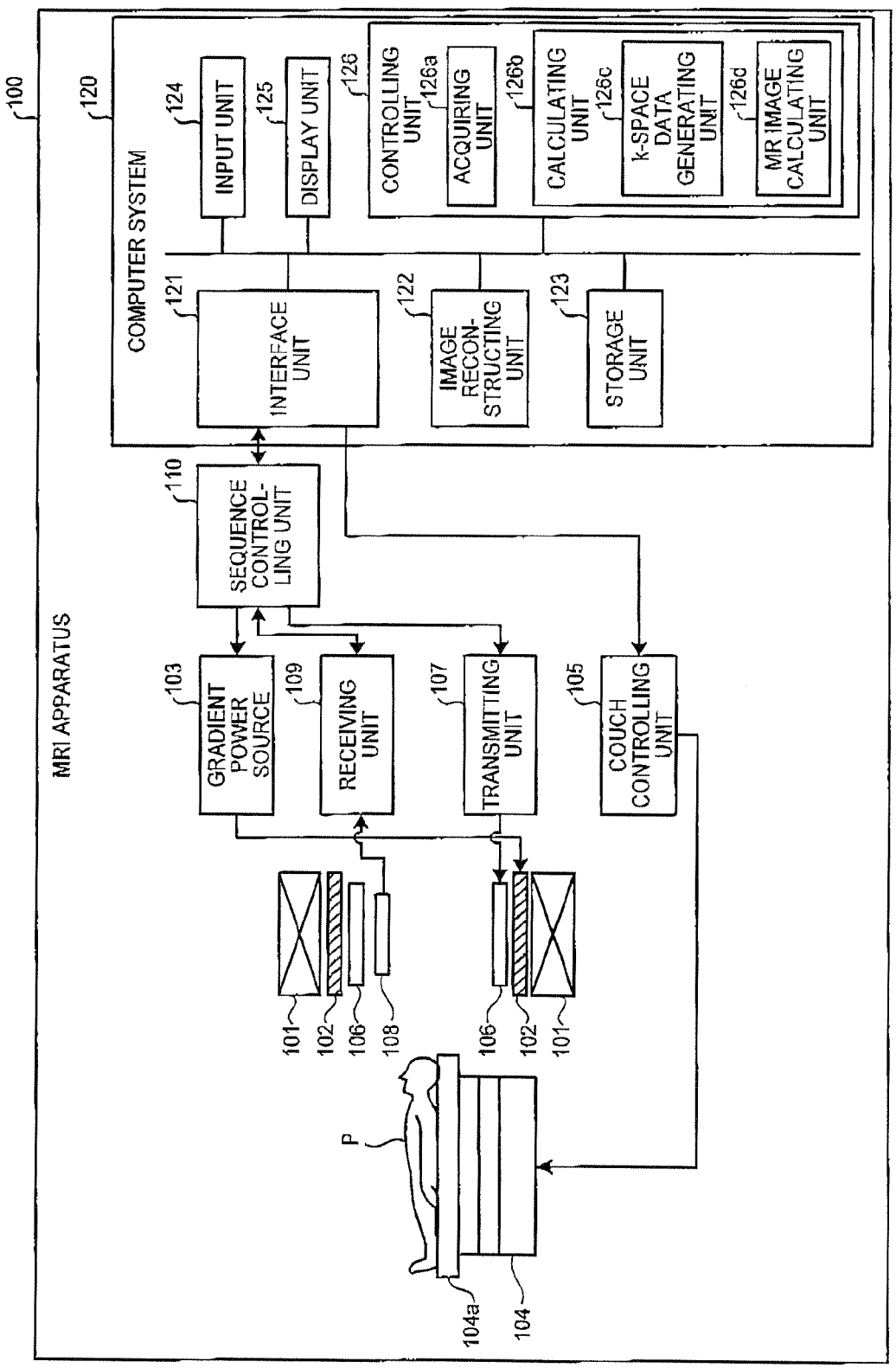

MAGNETIC RESONANCE IMAGING APPARATUS AND IMAGE PROCESSING APPARATUS

CROSS-REFERENCE TO RELATED APPLICATIONS

This application is based upon and claims the benefit of priority from Japanese Patent Application No. 2012-103918, filed on Apr. 27, 2012; and Japanese Patent Application No. 2012-201752, filed on Sep. 13, 2012; the entire contents of which are incorporated herein by reference.

FIELD

Embodiments described herein relate generally to a magnetic resonance imaging apparatus and an image processing apparatus.

BACKGROUND

A Magnetic Resonance Imaging apparatus (hereinafter, an "MRI apparatus", as necessary) detects Nuclear Magnetic Resonance signals (hereinafter, "NMR signals", as necessary) emitted from atoms (e.g., hydrogen atoms) in an examined subject (hereinafter, a "patient") by using a coil. Further, the MRI apparatus converts the detected NMR signals into raw data called 'k-space data' and to obtain an image (hereinafter, an "MR image", as necessary) indicating a distribution of target atoms by performing a reconstructing process that applies a conversion to the k-space data. By applying an inverse Fourier transform to the k-space data, the MRI apparatus obtains the MR image corresponding to the signals detected by the coil.

The k-space data are obtained by taking images of a three-dimensional target object. The MRI apparatus repeatedly takes one-dimensional images to obtain a two-dimensional cross-sectional image or a three-dimensional volume image during an imaging sequence. The MRI apparatus performs the one-dimensional image taking process by using a method called a frequency encoding process. To perform image taking processes in other dimensions, the MRI apparatus repeatedly performs the image taking process while changing the phase by using a method called a phase encoding process. To obtain a two-dimensional cross-sectional image, the MRI apparatus selects a cross section serving as an image taking target, by performing a slice selecting process on the three-dimensional target object.

In this situation, for example, to acquire k-space data corresponding to a desired resolution "256×256" in a k-space, the MRI apparatus sets the number of k-space lines to be imaged by performing the phase encoding process to "256" and repeatedly performs a one-dimensional image taking process 256 times. Thus, the image taking process takes a long period of time. For this reason, a parallel imaging technique has been studied as a method for reducing the number of k-space lines imaged by performing the phase encoding process. The parallel imaging technique is a technique developed by focusing on the fact that, when the k-space data are acquired by using a plurality of coils simultaneously, the sensitivity level varies depending on the positional arrangement of the coil. Examples of the parallel imaging technique include a SENSE-based (sensitivity encoding) technique and a SMASH-based (simultaneous acquisition of spatial harmonics) technique (e.g., a GRAPPA (generalized autocalibrating partially parallel acquisition) method). The parallel imaging technique has been applied to many MRI apparatuses and is widely used.

BRIEF DESCRIPTION OF THE DRAWINGS

FIG. 1 is a block diagram of an MRI apparatus according to a first embodiment;

DETAILED DESCRIPTION

Figure 2A:
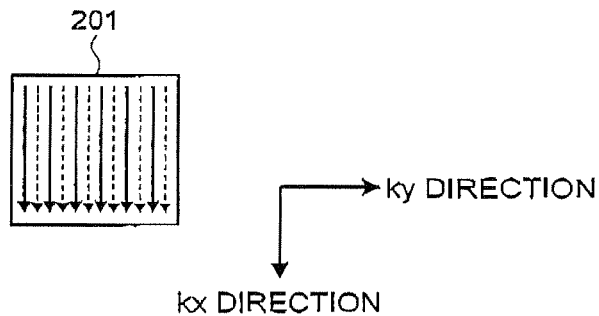
FIGS. 2A and 2B are drawings for explaining acquisition patterns of k-space data according to the first embodiment.

A magnetic resonance imaging apparatus according to an embodiment includes an arranging unit, a generating unit, and a reconstructing unit. The arranging unit arranges magnetic resonance signals acquired by implementing parallel imaging and correspond to a plurality of channels into a first region of a k-space so as to be positioned at first interval to generate first k-space data and into a second region larger than the first region so as to be positioned at second interval larger than the first interval to generate second k-space data. The generating unit generates third k-space data at the first interval corresponding to each of the plurality of channels, based on the second k-space data. The reconstructing unit reconstructs a magnetic resonance image, based on the first k-space data, the third k-space data, and sensitivity distributions corresponding to the plurality of channels.

Exemplary embodiments of a magnetic resonance imaging apparatus and an image processing apparatus will be explained in details below. Unless otherwise noted, the exemplary embodiments will be explained by using an example with two-dimensional k-space data; however, it is possible to implement the methods described below even if the number of dimensions of the k-space data is not two. The exemplary embodiments will be explained on the assumption that no down-sampling process is performed in a kx direction (a frequency encoding direction) of the k-space; however, the explanation is not intended to limit applications of other acquisition methods by which a down-sampling process is performed in the kx direction. Further, in the explanation below, an example is used in which an acquisition process is performed in the k-space in the manner of a grid; however, as long as the acquisition method allows the utilization of a parallel imaging technique, the explanation is not intended to limit k-space data acquisition processes that use other scanning methods besides the one performed in the manner of a grid. Further, unless otherwise noted, it is assumed that k-space data and MR image data are expressed by using complex numbers. An MR image used for making a medical diagnosis is obtained by, for example, calculating the value of the complex number for each of the pixels in the MR image explained in the exemplary embodiments below. Any of a Fourier transform or an inverse Fourier transform may be sufficient as a method for conversion from k-space to image space. This method is determined according to a sampling method of k-space data.

First Embodiment

FIG. 1 is a block diagram of an MRI apparatus 100 according to a first embodiment. As shown in FIG. 1, the MRI apparatus 100 includes: a magnetostatic field magnet 101, a gradient coil 102, a gradient power source 103, a couch 104, a couch controlling unit 105, a transmission coil 106, a transmitting unit 107, a reception coil array 108, a receiving unit 109, a sequence controlling unit 110, and a computer system 120. The MRI apparatus 100 does not include a patient P (e.g., a human body).

The magnetostatic field magnet 101 is a magnet formed in the shape of a hollow circular cylinder and generates a uniform magnetostatic field in the space on the inside thereof. The magnetostatic field magnet 101 may be configured by using, for example, a permanent magnet, a superconductive magnet, or the like. The gradient coil 102 is a coil formed in the shape of a hollow circular cylinder and is disposed on the inside of the magnetostatic field magnet 101. The gradient coil 102 is formed by combining three coils corresponding to X-, Y-, and Z-axes that are orthogonal to one another. These three coils individually receive a supply of electric current from the gradient power source 103 and generate gradient magnetic fields of which the magnetic field intensities change along the X-, Y-, and Z-axes. It is assumed that the Z-axis direction is the same as the direction of the magnetostatic field.

The gradient power source 103 supplies the electric current to the gradient coil 102. In this situation, the gradient magnetic fields on the X-, Y-, and Z-axes that are generated by the gradient coil 102 correspond to, for example, a slice-selecting-purpose gradient magnetic field Gs, a phase-encoding-purpose gradient magnetic field Ge, and a read-out-purpose gradient magnetic field Gr, respectively. The slice-selecting-purpose gradient magnetic field Gs is used for determining an image-taking cross section in an arbitrary manner. The phase-encoding-purpose gradient magnetic field Ge is used for changing the phase of an NMR signal according to a spatial position. The read-out-purpose gradient magnetic field Gr is used for changing the frequency of an NMR signal according to a spatial position.

The couch 104 includes a couchtop 104a on which the patient P is placed. Under control of the couch controlling unit 105, while the patient P is placed thereon, the couchtop 104a is inserted into the hollow (i.e., an image taking opening) of the gradient coil 102. Normally, the couch 104 is provided so that the longitudinal direction thereof extends parallel to the central axis of the magnetostatic field magnet 101. Under control of the computer system 120, the couch controlling unit 105 drives the couch 104 so that the couchtop 104a moves in the longitudinal direction and in an up-and-down direction.

The transmission coil 106 is disposed on the inside of the gradient coil 102 and generates a radio-frequency magnetic field by receiving a supply of a Radio Frequency (RF) pulse from the transmitting unit 107. The transmitting unit 107 supplies the RF pulse corresponding to a Larmor frequency, which is determined by the type of a target atom and the intensity of the magnetic field, to the transmission coil 106.

The reception coil array 108 is disposed on the inside of the gradient coil 102 and receives NMR signals emitted from the patient P due to an influence of the radio-frequency magnetic field. When having received the NMR signals, the reception coil array 108 outputs the received NMR signals to the receiving unit 109. In the first embodiment, the reception coil array 108 is configured as a coil array including a plurality of reception coils.

Based on the NMR signals being output from the reception coil array 108, the receiving unit 109 generates NMR data. More specifically, the receiving unit 109 generates the NMR data by applying a digital conversion to the NMR signals being output from the reception coil array 108. Further, the receiving unit 109 transmits the generated NMR data to the sequence controlling unit 110. The receiving unit 109 may be provided on a gantry device side where the magnetostatic field magnet 101 and the gradient coil 102 are provided. In the first embodiment, the NMR signals output from the coil elements (the reception coils) included in the reception coil array 108 are divided and/or combined as appropriate, before being output to the receiving unit 109 in units called "channels", for example. Thus, the NMR data are handled in units of channels in the processes performed by the receiving unit 109 and at the stages subsequent thereto. As for the relationship between the total quantity of coil elements and the total quantity of channels, the two quantities may be equal, or the total quantity of channels may be smaller than the total quantity of coil elements, or conversely, the total quantity of channels may be larger than the total quantity of coil elements. In the following explanation, the expression "each of the reception coils (each of the channels)" indicates that the process may be performed in correspondence with each of the coil elements or may be performed in correspondence with each of the channels that are obtained by dividing and/or combining the coil elements. Further, the timing with which the coil elements are divided and/or combined is not limited to the example stated above. Any timing is acceptable as long as the NMR signals or the NMR data are divided and/or combined in units of channels prior to a reconstructing process performed by an image reconstructing unit 122 (explained later).

The sequence controlling unit 110 performs an image taking process on the patient P, by driving the gradient power source 103, the transmitting unit 107, and the receiving unit 109, based on sequence information transmitted from the computer system 120. In this situation, the sequence information is information that defines a procedure for performing the image taking process. The sequence information defines, for example, the intensity of the electric power to be supplied by the gradient power source 103 to the gradient coil 102 and the timing with which the electric power is to be supplied; the strength of the RF pulse to be transmitted by the transmitting unit 107 to the transmission coil 106 and the timing with which the RF pulse is to be applied; and the timing with which the NMR signals are to be detected by the receiving unit 109.

When the sequence controlling unit 110 has received the NMR data from the receiving unit 109, as a result of driving the gradient power source 103, the transmitting unit 107, and the receiving unit 109 and taking the image of the patient P, the sequence controlling unit 110 transfers the received NMR data to the computer system 120.

The computer system 120 exercises overall control of the MRI apparatus 100, acquires data, and reconstructs images. The computer system 120 includes an interface unit 121, the image reconstructing unit 122, a storage unit 123, an input unit 124, a display unit 125, and a controlling unit 126.

The interface unit 121 transmits the sequence information to the sequence controlling unit 110 and receives the NMR data from the sequence controlling unit 110. When having received the NMR data, the interface unit 121 stores the received NMR data into the storage unit 123. The NMR data stored in the storage unit 123 is arranged into a k-space by an acquiring unit 126a (explained later). As a result, the storage unit 123 stores therein k-space data corresponding to a plurality of channels.

The image reconstructing unit 122 generates spectrum data or image data by applying a reconstructing process such as a Fourier transform process to the k-space data stored in the storage unit 123. The storage unit 123 stores therein, for example, the NMR data received by the interface unit 121, the k-space data arranged in the k-space by the acquiring unit 126a, and the image data generated by the image reconstructing unit 122. For example, the storage unit 123 is configured by using a semiconductor memory element such as a Random Access Memory (RAM) or a flash memory, a hard disk, an optical disk, or the like. The input unit 124 receives various types of instructions and inputs of information from an operator. The input unit 124 is configured by using a pointing device such as a mouse or a trackball, a selecting device such as a mode changing switch, and/or an input device such as a keyboard. Under control of the controlling unit 126, the display unit 125 displays various types of information such as spectrum data and/or the image data. The display unit 125 is configured by using, for example, a display device such as a liquid crystal display device.

The controlling unit 126 exercises overall control of the MRI apparatus 100. More specifically, the controlling unit 126 controls the image taking process by generating the sequence information based on an image taking condition input from the operator via the input unit 124 and transmitting the generated sequence information to the sequence controlling unit 110. Further, the controlling unit 126 controls the image reconstructing process that is performed based on the NMR data transmitted from the sequence controlling unit 110 as a result of the image taking process and controls the display process realized by the display unit 125. For example, the controlling unit 126 is configured by using an integrated circuit such as an Application Specific Integrated Circuit (ASIC) or a Field Programmable Gate Array (FPGA), or an electronic circuit such as a Central Processing Unit (CPU) or a Micro Processing Unit (MPU).

The MRI apparatus 100 according to the first embodiment is configured to improve the image quality of the MR image to be reconstructed while shortening the time period required by the image taking process (hereinafter, the "image taking period"), by acquiring the k-space data by regularly employing a down-sampling process performed at first interval and a down-sampling process performed at second interval larger than the first interval. This function is realized by the control exercised by, for example, the functional units included in the controlling unit 126 described above. As shown in FIG. 1, the controlling unit 126 includes the acquiring unit 126a and a calculating unit 126b.

The acquiring unit 126a acquires the k-space data in correspondence with each of the reception coils (each of the channels), by regularly employing the down-sampling process performed at the first interval and the down-sampling process performed at the second interval larger than the first interval, with respect to k-space lines corresponding to a desired resolution level. For example, the acquiring unit 126a acquires the NMR data in correspondence with each of the reception coils (each of the channels) by controlling the sequence controlling unit 110 and the like, arranges the acquired NMR data into the k-space, and stores the arranged result into the storage unit 123. In this situation, the acquiring unit 126a arranges the acquired NMR data into a first region of the k-space so as to be positioned at the first interval and into a second region larger than the first region so as to be positioned at the second interval larger than the first interval. The details of the process performed by the acquiring unit 126a will be explained later.

The calculating unit 126b calculates the MR image by using the k-space data acquired by the acquiring unit 126a in correspondence with each of the reception coils (each of the channels) and stored into the storage unit 123. For example, the calculating unit 126b calculates the MR image by controlling the image reconstructing unit 122 and the like and by using the k-space data stored in the storage unit 123. Further, for example, the calculating unit 126b exercises control so that the calculated MR image is displayed on the display unit 125. As shown in FIG. 1, the calculating unit 126b includes a k-space data generating unit 126c and an MR image calculating unit 126d.

By using the k-space data acquired by the acquiring unit 126a in correspondence with each of the reception coils (each of the channels) by performing the down-sampling process at the second interval, the k-space data generating unit 126c generates, in correspondence with each of the reception coils (each of the channels), k-space data at the first interval in the positions to fill in the k-space lines that were thinned out in the down-sampling process performed at the second interval. Further, the k-space data generating unit 126c transmits the k-space data at the first interval generated in correspondence with each of the reception coils (each of the channels), to the MR image calculating unit 126d. The details of the process performed by the k-space data generating unit 126c will be explained later.

The MR image calculating unit 126d calculates the MR image by combining, for each of the reception coils (each of the channels), the k-space data at the first interval generated by the k-space data generating unit 126c in correspondence with each of the reception coils (each of the channels), with the k-space data acquired in correspondence with each of the reception coils (each of the channels) by performing the down-sampling process at the first interval. The details of the process performed by the MR image calculating unit 126d will be explained later.

Next, a SENSE method and a GRAPPA method will be explained. Generally speaking, when using a SENSE method, an MRI apparatus acquires k-space data for a training purpose in advance, performs a reconstructing process on the acquired k-space data, and calculates a sensitivity distribution (which may also be referred to as a "sensitivity map") of each of the reception coils (each of the channels). For example, the MRI apparatus calculates the sensitivity distributions by acquiring the training-purpose k-space data (which may also be referred to as "calibration data") by performing a sensitivity map image taking process (which may also be referred to as a "calibration scanning process") as a preparatory image taking process (an image taking process that precedes a main image taking process performed for taking diagnosis images). During an image taking process performed after the training, the MRI apparatus acquires k-space data by performing a down-sampling process at regular interval. For example, the MRI apparatus acquires only even-numbered k-space lines. Subsequently, when the MRI apparatus has reconstructed the data of each of the channels (k-space data corresponding to each of the reception coils) by using the acquired k-space data, a folded MRI image is obtained. After that, the MRI apparatus calculates a high-resolution MRI image by unfolding the folded components, while using the MRI images corresponding to the channels and the sensitivity distributions calculated from the training. Because the sampling is performed with the down-sampling process, it is possible to shorten the image taking period. For example, when only the even-numbered samples are sampled, the image taking period becomes a half. A linear system generated in the unfolding process according to the SENSE method may become an ill-posed or ill-conditioned linear system, depending on the relationship between the number of unknown pixels and the number of coils. In that situation, to stabilize the linear system, regularization may be performed by introducing prior knowledge about solutions.

In contrast, when using a GRAPPA method, an MRI apparatus acquires k-space data by performing a down-sampling process at regular interval and estimates the thinned-out data based on the data positioned nearby in the k-space. The estimation is realized by implementing a method by which missing data for each of the channels is calculated from a weighted linear sum by using the k-space data corresponding to all the channels. The weight is calculated from training-purpose data that is obtained by performing a full sampling process (by acquiring the data without performing a down-sampling process) on a part of the k-space (e.g., a central part of the k-space) for a training purpose.

When the k-space data are considered as such data that is obtained by imaging a Fourier transform of the distribution of the target atoms, it is known that the values acquired from a part corresponding to a low-frequency region (hereinafter, a "central part of the k-space") is larger than the values acquired from a part corresponding to a high-frequency region (hereinafter, a "peripheral part of the k-space"). According to the SENSE method and the GRAPPA method, because the down-sampling process is performed at regular interval (except for the training-purpose data in the GRAPPA method), the data are acquired with an equal density, from the central part and from the peripheral part of the k-space. It is considered, however, that it is possible to improve the quality of the reconstructed image while the number of k-space lines remains the same, by arranging the sampling density in the central part of the k-space, which contributes more to the image quality of the MRI image, to be higher than the sampling density in the peripheral part.

It may also be possible to apply a parallel imaging technique to k-space data randomly acquired by using a variable density. However, for example, if a desired sampling density function is generated so as to vary the sampling density accordingly, the number of pixels to be handled in the unfolding process increases in the SENSE method, whereas the number of estimation formulae explosively increases and a large number of training-purpose lines are required for estimating the part where the data are acquired with a lower density in the GRAPPA method.

The MRI apparatus 100 according to the first embodiment is configured to obtain an MR image with high image quality, by applying a parallel imaging technique to k-space data acquired by performing a down-sampling process at the first interval, which are "more dense". It is, however, not necessarily desirable to acquire all of the k-space lines by performing the down-sampling process at the first interval, considering the correlation with the image taking period. For this reason, with respect to the entire k-space, the MRI apparatus 100 according to the first embodiment acquires k-space data while performing a down-sampling process at the second interval, which are "less dense". With respect to the central part of the k-space, the MRI apparatus 100 acquires k-space data by performing a down-sampling process at the first interval, which are "more dense", and further generates k-space data at the first interval used for filling in the thinned-out k-space lines, by using the k-space data acquired by performing the down-sampling process at the second interval.

In this situation, the MRI apparatus 100 according to the first embodiment also employs the parallel imaging technique when generating the k-space data at the first interval, which are "more dense", by using the k-space data at the second interval which are "less dense". As explained herein, the MRI apparatus 100 according to the first embodiment is configured to obtain the MR image with high image quality, by employing the parallel imaging technique a plurality of times. For this purpose, the MRI apparatus 100 is configured to acquire the pieces of data that are thinned at the mutually-different intervals in a regular manner, and not in a random manner. In other words, the MRI apparatus 100 makes it possible to employ the parallel imaging technique by performing the acquisition process regularly so as to acquire the data at regular interval throughout the entire k-space, at least when acquiring the k-space data by performing the down-sampling process at the second interval. This process may be considered as applying a restriction to the acquisition of the k-space data in such a manner that the existing parallel imaging technique for data sampled using a regular interval can be diverted in this use. Further, in the first embodiment, the example is explained in which the data are acquired at regular interval throughout the entire k-space, at least when the k-space data are acquired by performing the down-sampling process at the second interval. However, the exemplary embodiments are not limited to this example. For example, the MRI apparatus 100 may perform a zero-fill process without acquiring any k-space data from a part of the k-space peripheral part, when acquiring the k-space data by performing the down-sampling process at the second interval.

Figure 2B:
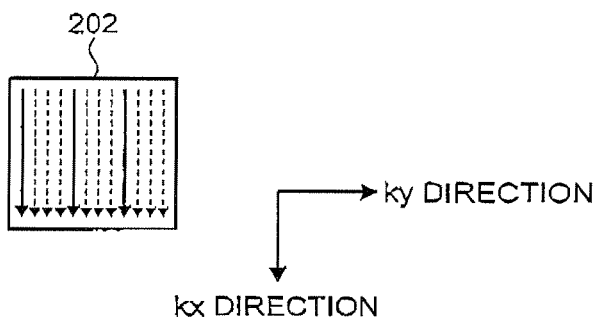

Next, the process performed by the acquiring unit 126a will be explained in details. FIGS. 2A and 2B are drawings for explaining sampling intervals of the k-space data according to the first embodiment and illustrates examples of acquisition patterns used when a regular-interval parallel imaging technique is employed. In FIGS. 2A and 2B, kx denotes the frequency encoding direction, whereas ky denotes the phase encoding direction. Further, in FIGS. 2A and 2B, each of the arrows indicating the data points to be filled in the kx direction represents one k-space line. Further, each of the solid arrows represents a k-space line that is acquired without being thinned out, whereas each of the dotted arrows represents a k-space line that is not acquired due to the down-sampling process.

An acquisition pattern 201 shown in FIG. 2A is an acquisition pattern (hereinafter, "two-sample intervals") in which one of every two k-space lines are acquired. In contrast, an acquisition pattern 202 shown in FIG. 2B is an acquisition pattern (hereinafter, "four-sample intervals") in which three of every four k-space lines are not acquired.

The acquisition methods explained herein is based on the following notion. In the following explanation, A and B are each a real number larger than 1. Also, in the example explained below, A and B are each an integer. However, because the SENSE method, which employs a parallel imaging technique, is applicable even to a down-sampling interval that is not an integer (considering that the number of pixels to be folded varies depending on the positions), A and B do not necessarily have to be an integer when the SENSE method is implemented.

When it is possible to perform an image reconstructing process corresponding to the intervals A, which are the larger intervals, on the k-space data obtained by performing a down-sampling process at the intervals A, it should also be possible to reconstruct a k-space that is thinned out at the intervals B, which are the smaller intervals, from a reconstructed MR image. Accordingly, it should also be possible to reconstruct an image corresponding to the intervals B, by using the true values for the data acquired at the intervals B, which are the smaller intervals, and by using re-generated k-space data for the data that was not acquired. For this reason, let us discuss a situation where all the k-space lines are acquired at the intervals A, whereas only a part of the k-space lines are acquired at the intervals B. While the number of k-space lines to be acquired is taken into consideration, the image quality of the MR image obtained by reconstructing the k-space data acquired by the present acquisition method (the acquisition method according to the first embodiment) is considered to be higher than the image quality of an MR image obtained by performing a reconstructing process on a regular-interval acquisition performed at the intervals A and is considered to be lower than the image quality of an MR image obtained by performing a reconstructing process on a regular-interval acquisition performed at the intervals B. In order to make the image quality of the acquisition method according to the first embodiment closer to the image quality of the regular-interval acquisition performed at the intervals B while keeping an increasing amount in the number of acquired k-space lines small, it is considered desirable to determine an acquisition pattern in such a manner that the data are mainly acquired at the intervals B in the central part where the signal strength is higher in the k-space and in such a manner that the data are mainly acquired at the intervals A in the peripheral part where the signal strength is lower.

Figure 3:
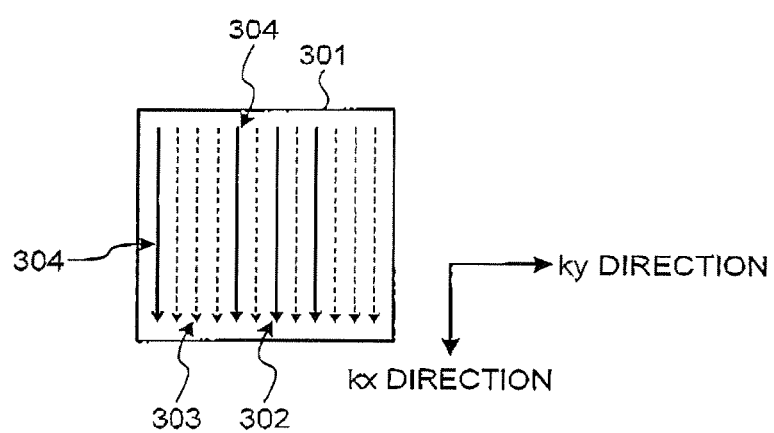
FIG. 3 is a drawing of an acquisition pattern of the k-space data according to the first embodiment.

FIG. 3 is a drawing of an acquisition pattern of k-space data according to the first embodiment and illustrates an exemplary acquisition pattern that is suitable for the first embodiment. An acquisition pattern 301 shown in FIG. 3 is an acquisition pattern (in a two-dimensional k-space) where A=4 and B=2 are satisfied. All of the k-space lines 304 positioned at the intervals A (=4) serve as sampling (acquisition) targets. In contrast, of k-space lines 302 and 303 positioned at the intervals B (=2), although the k-space line 302 positioned closer to the central part of the k-space serves as an acquisition target, the k-space line 303 positioned in the peripheral part of the k-space does not serve as an acquisition target.

Figure 4:
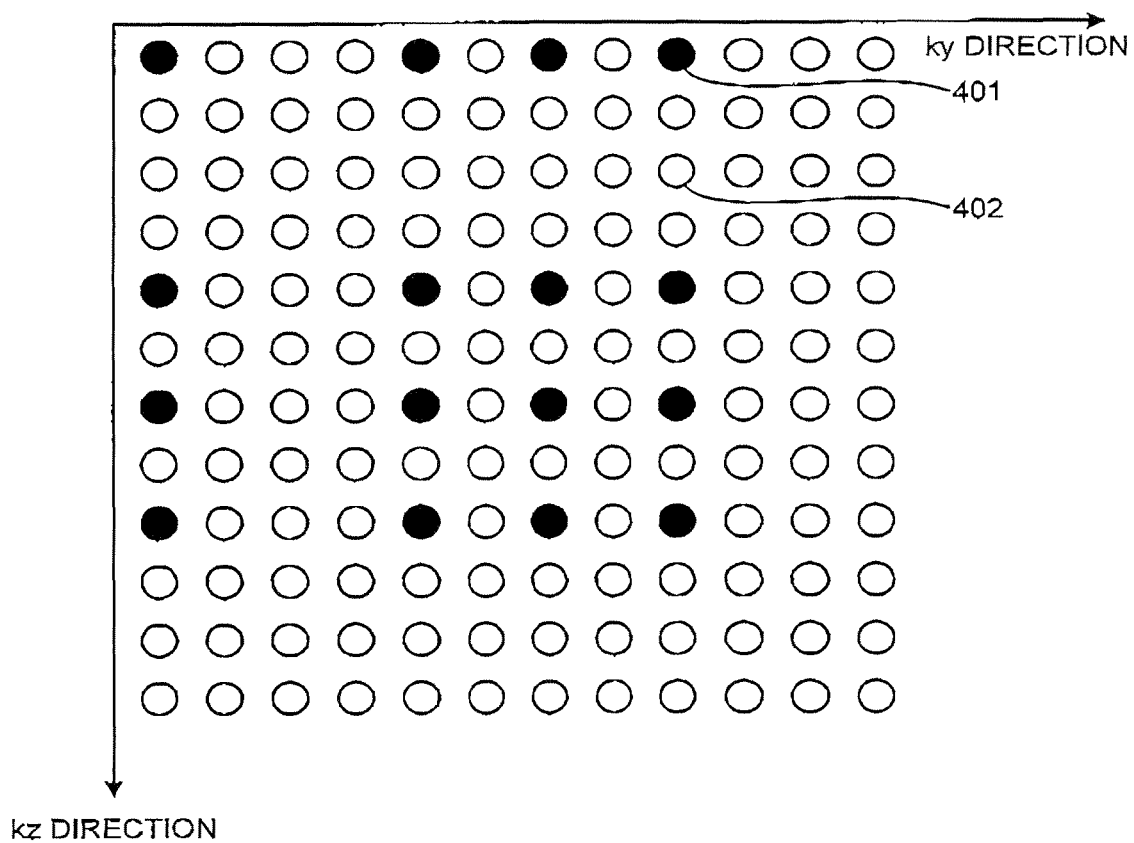
FIG. 4 is a drawing of another acquisition pattern of the k-space data according to the first embodiment.

As another example, FIG. 4 is a drawing of another acquisition pattern of k-space data according to the first embodiment and illustrates an exemplary acquisition pattern in a three-dimensional k-space. It should be noted that FIG. 4 shows only the ky and the kz directions (the phase encoding directions), and the kx direction (the frequency encoding direction) is omitted from the drawing. For this reason, each of the dots corresponds to "one" k-space line. Each of the black dots represents a k-space line that is acquired without being thinned out, whereas each of the white dots represents a k-space line that is not acquired due to the down-sampling process.

The acquisition pattern shown in FIG. 4 is an acquisition pattern in which A=4 and B=2 are satisfied in each of the ky and the kz directions. This acquisition pattern is an example expanded to three dimensions by applying the sampled positions in the ky direction in FIG. 3 to each of the axes in the ky and the kz directions in FIG. 4 and by using only such positions that serve as acquisition targets on both of the axes in the ky and the kz directions as the acquisition targets. For example, a position 401 is used as an acquisition target, whereas a position 402 is not used as an acquisition target. Although FIG. 4 illustrates the example of the acquisition pattern in which the down-sampling process is performed on both of the axes in the ky and the kz directions, the exemplary embodiments are not limited to this example. For example, another sampling pattern is also acceptable in which a down-sampling process is performed only one of the axes, whereas a full sampling process is performed on the other axis. For example, a sampling pattern is acceptable in which a down-sampling process is performed in the ky direction, whereas a full sampling process is performed in the kz direction. Alternatively, another sampling pattern is acceptable in which a down-sampling process is performed in the kz direction, whereas a full sampling process is performed in the ky direction.

In the explanation above, the example in which A=4 and B=2 are satisfied is used. In other words, the acquiring unit 126a according to the first embodiment sets the interval A and the interval B so that the intervals at which the k-space lines are acquired without being thinned out is once per an integer number of times (e.g., once every four times and once every two times) and so that the intervals A are each an integer multiple of the intervals B. However, other examples are also acceptable where a ratio other than 2 is used such as A=6 and B=2, where the value of A or B is not an integer such as A=3 and B=1.5, and where A is not an integer multiple of B such as A=5 and B=2. It should be noted that, however, when A is set to be an integer multiple of B, all of the k-space data used in the parallel imaging process at a previous stage can be used in the parallel imaging process at a subsequent stage. Thus, because it is possible to reduce the number of estimated sample values to be used that are re-generated at the intervals B and that contain noise, the image quality is expected to improve compared to the situation where A is not a integer multiple of B. Further, depending on the image reconstructing method employed (e.g., if the GRAPPA method is used), the reconstructing process does not necessarily have to be performed in two stages. An example using the GRAPPA method will be explained later.

An overall flow using a sampling method according to an exemplary embodiment

Figure 5:
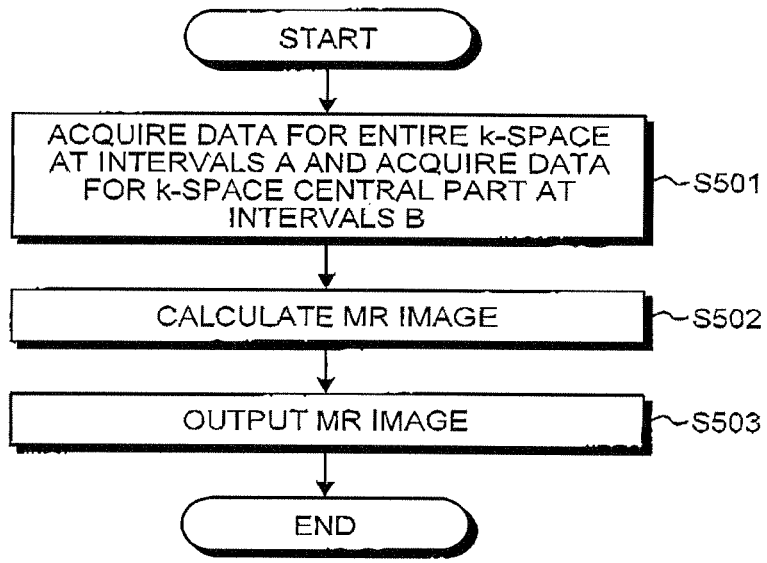
FIG. 5 is a flowchart of a processing procedure according to the first embodiment.

FIG. 5 is a flowchart of a processing procedure according to the first embodiment and illustrates a flow in an image reconstructing process performed by the MRI apparatus 100 when performing a variable-density sampling process while restricting sampled positions.

First, the acquiring unit 126a acquires data for the entire k-space while performing a down-sampling process at the intervals A and also acquires data for a central part of the k-space while performing a down-sampling process at the intervals B (step S501). In other words, the acquiring unit 126a acquires a set of k-space lines (hereinafter, a "k-space line set") containing all of the k-space lines at the intervals A and a part of the k-space lines at the intervals B. This process is performed as described above, and as for the format thereof, the process at step S501 can be explained as follows. When A and B are each an integer (where A>B>=2), such k-space lines that satisfy the following three conditions are acquired: (1) include all of a first k-space line set that is made up of the k-space lines acquired by performing a down-sampling process at the intervals A in the k-space; (2) include at least one k-space line that is different from any of the k-space lines in the first k-space line set and is selected from among a second k-space line set that is made up of the k-space lines acquired by performing a down-sampling process at the intervals B in the k-space; and (3) arrange the total quantity of k-space lines in the second k-space line set to be smaller than the quantity of all the k-space lines at the intervals B. For example, the acquiring unit 126a is able to perform the acquisition process in this manner by controlling the sequence controlling unit 110.

Subsequently, the calculating unit 126b calculates an MR image by using the k-space data acquired at step S501 (step S502). For example, by controlling the image reconstructing unit 122, the calculating unit 126b obtains the MR image by performing a reconstructing process on the k-space data stored in the storage unit 123. In this situation, it is assumed that the calculating unit 126b is somehow informed of the positions at which the data are acquired by the acquiring unit 126a. For instance, the calculating unit 126b may determine the sampled positions in advance. Alternatively, the acquiring unit 126a may be configured so as to transmit information about the sampled positions, when transmitting the k-space data to the calculating unit 126b.

After that, the calculating unit 126b exercises control so that the MR image reconstructed at step S502 is displayed on the display unit 125 (step S503).

Figure 6:
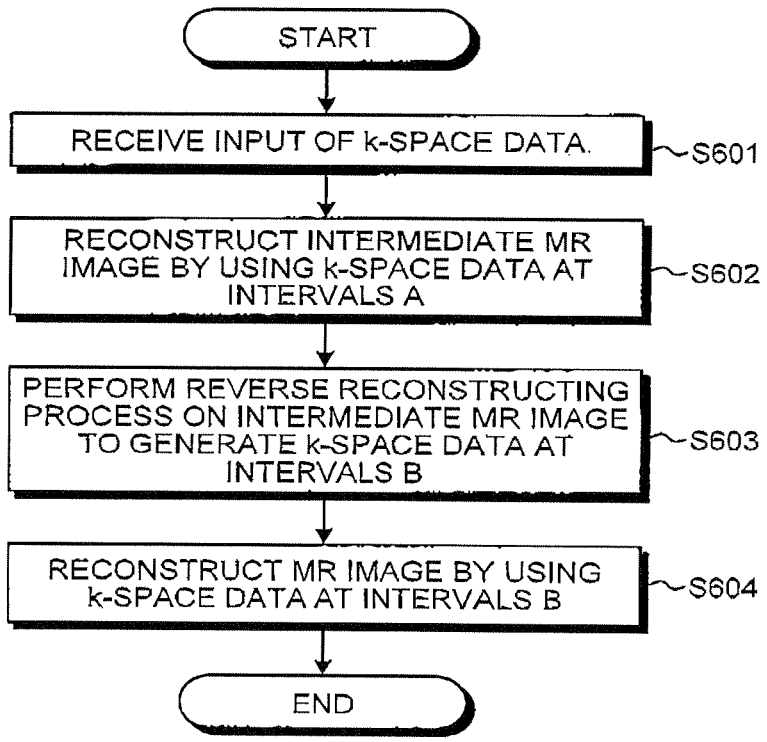
FIG. 6 is another flowchart of the processing procedure according to the first embodiment.

FIG. 6 is another flowchart of the processing procedure according to the first embodiment and illustrates an exemplary flow of the MR image reconstructing method implemented by the calculating unit 126b. The MR image reconstructing method will be explained, with reference to FIG. 7 serving as an explanation drawing.

First, the k-space data generating unit 126c receives an input of k-space data (e.g., pieces of k-space data 701 shown in FIG. 7) acquired by the acquiring unit 126a (step S601). If the sampled positions of the k-space data are unknown to the k-space data generating unit 126c, an input of the information about the sampled positions of the k-space data are further received from the acquiring unit 126a at step S601.

Figure 7:
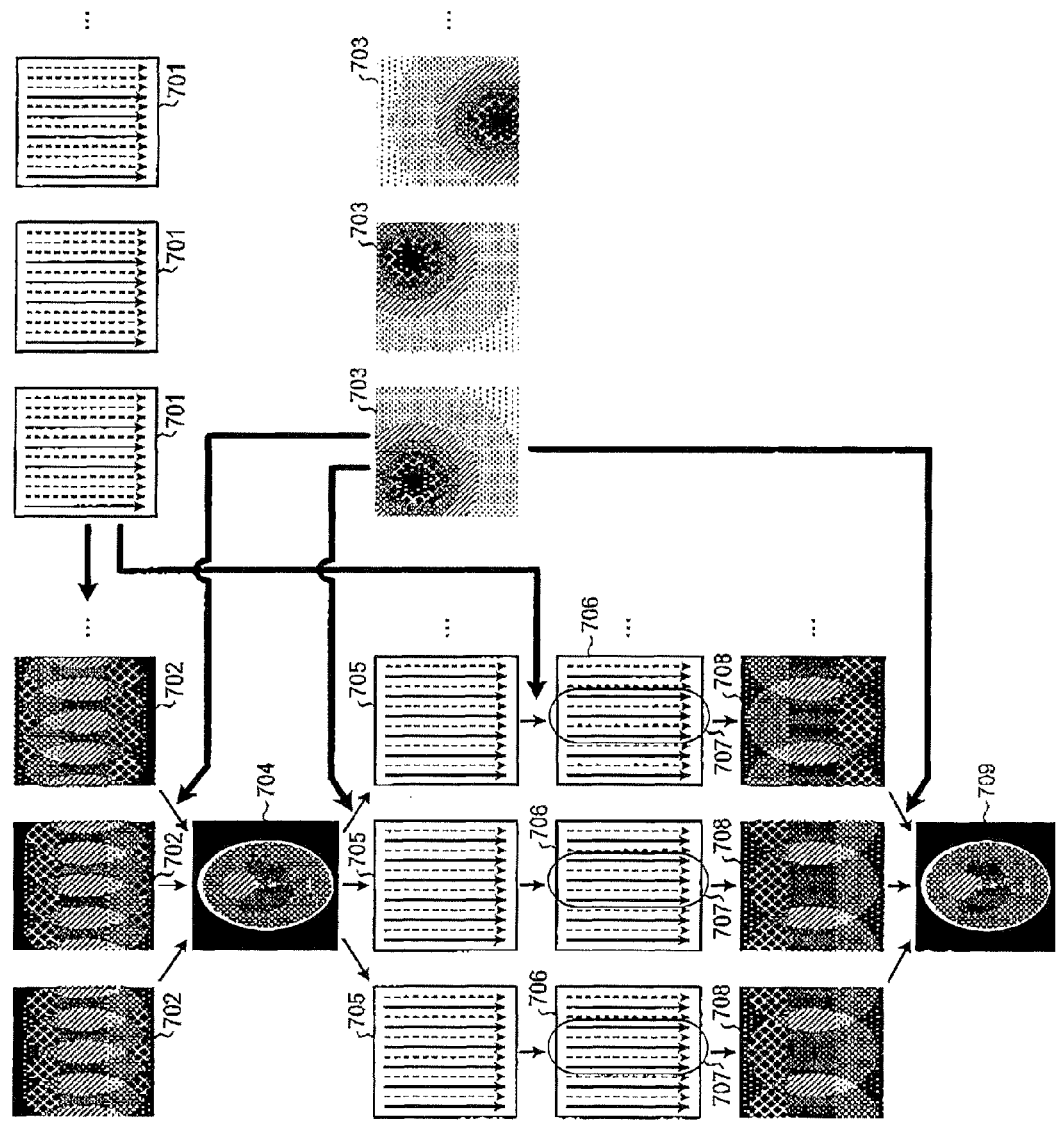
FIG. 7 is a drawing of an MR image calculating process according to the first embodiment.

Subsequently, the k-space data generating unit 126c reconstructs an intermediate MR image, by using the k-space data acquired in correspondence with each of the reception coils (each of the channels) by performing the down-sampling process at the intervals A (step S602). Because the MR image generated at this step is not an MR image used in a final output, the MR image will be referred to as "intermediate MR image", for the sake of convenience. For example, if the SENSE method is used (an example of a formula solved by using the SENSE method will be explained later), after performing a reconstructing process with respect to each of the channels (each of the reception coils (each of the channels)) on the pieces of k-space data 701 received as the input, the k-space data generating unit 126c performs an unfolding process corresponding to the intervals A by using sensitivity distributions 703. Although FIG. 7 illustrates folded images 702 that are reconstructed at the resolution level prior to the down-sampling process, it is also acceptable to implement the SENSE method by reconstructing images at the resolution level after the down-sampling process.

The process at step S602 can be rephrased as follows: First, the k-space data generating unit 126c obtains the folded images 702 by reconstructing each of the pieces of k-space data 701 acquired in correspondence with the reception coils (the channels) by performing a down-sampling process at the intervals A. Subsequently, the k-space data generating unit 126c calculates an intermediate MR image 704 by performing the unfolding process using the parallel imaging technique, by applying the sensitivity distributions 703 corresponding to the reception coils (the channels) to the folded images 702, respectively.

After that, the k-space data generating unit 126c performs an inverse reconstructing process on the intermediate MR image reconstructed at step S602, by using the sensitivity distributions 703 (step S603). More specifically, the reverse reconstructing process is performed in the following manner. The intermediate MR image is a single image. First, the k-space data generating unit 126c generates a weighted intermediate MR image corresponding to each of the channels (each of the reception coils), by applying the sensitivity distributions 703 to each of the pixels within the intermediate MR image. Because the generated intermediate MR image corresponding to each of the channels is an image on which no folding process is performed (an image that is not folded), the k-space data generating unit 126c performs a folding process. (The k-space data generating unit 126c performs a weighted addition, according to a weight that is determined depending on the phase of a position serving as the acquisition target. The weight can be found out from a transform formula of a discrete Fourier transform.)

The process at step S603 can be rephrased as follows: First, the k-space data generating unit 126c calculates intermediate MR images 704' reflecting the sensitivity levels of the reception coils (the channels) by applying each of the sensitivity distributions 703 corresponding to the reception coils (the channels) to the calculated intermediate MR image 704 and subsequently generates k-space data in correspondence with each of the reception coils (each of the channels) by performing an inverse reconstructing process on each of the calculated intermediate MR images 704'. Further, the k-space data generating unit 126c generates pieces of (estimated) k-space data 705 at the intervals B in correspondence with the reception coils (the channels), by performing a down-sampling process on the k-space data generated in correspondence with each of the reception coils (the channels).

After that, the MR image calculating unit 126d generates k-space data at the intervals B (in correspondence with each of the channels) by using the pieces of estimated k-space data 705 obtained from the reverse reconstructing process at step S603 and the k-space data received as the input at step S601 and subsequently obtains a final MR image 709 by performing a reconstructing process at the intervals B (step S604). The reconstructing process at the intervals B can be realized by, for example, implementing the SENSE method so as to obtain the MR image 709 by performing an unfolding process while using the sensitivity distributions 703 and the k-space data generated in the previous operation. As for the k-space data at the intervals B, for example, for such k-space lines that are provided as the input at step S601, the k-space data thereof can be used, and for such k-space lines that are missing from the input at step S601 but are required by the reconstructing process at the intervals B, the k-space data obtained from the reverse reconstructing process performed at step S603 can be used. Further, as for the k-space data provided as the input at step S601, for example, a weighted average calculated with the k-space data obtained from the reverse reconstructing process may be used.

The process at step S604 can be rephrased as follows: First, the MR image calculating unit 126d generates pieces of k-space data 706 at the intervals B corresponding to the reception coils (the channels), by combining the pieces of k-space data 705 at the intervals B generated by the k-space data generating unit 126c in correspondence with the reception coils (the channels), with pieces of k-space data at the intervals B that are among the pieces of k-space data 701 actually acquired by the acquiring unit 126a. In FIG. 7, the pieces of k-space data at the intervals B that were actually acquired and are combined with the pieces of k-space data 705 at the intervals B are the k-space lines shown with solid lines in the central parts marked with ovals 707. To combine the data, it is acceptable to overwrite the data with the k-space data that was actually acquired. Alternatively, it is also acceptable to combine the two pieces of data together after applying weights thereto. After that, the MR image calculating unit 126d obtains folded images 708 by performing a reconstructing process on each of the pieces of k-space data 706 at the intervals B. Subsequently, the MR image calculating unit 126d calculates the MR image 709 serving as the final output by performing the unfolding process according to the parallel imaging technique, by applying the sensitivity distributions 703 corresponding to the reception coils (the channels) to the folded images 708, respectively.

In the description above, the example is explained in which the image reconstructing process is performed in the two-stage configuration according to the SENSE method; however, it is acceptable to use a configuration that uses three or more stages. For example, when a three-stage configuration is used, the calculating unit 126b performs a reconstructing process as follows: The calculating unit 126b performs the two-stage reconstructing process (steps S601 through S604) on A and C (i.e., C being used as B described above), where C and D are divisors of A that satisfy C>D. After that, the calculating unit 126b performs the reverse reconstructing process (step S603) that uses the sensitivity distributions and the reconstructing process (step S604) on C and D (i.e., D being used as B described above). Similarly to the example explained above, C and D do not necessarily have to be divisors of A. Further, in a configuration that uses three or more stages, the last stage may be performed as a full sampling process that involves no down-sampling process.

Using Prior Information in the SENSE Method

Incidentally, as a method for reconstructing an MR image from k-space data from which a part of the k-space is missing due to a high-speed image taking process, a method is known by which "prior" information is evaluated in addition to the k-space data resulting from an image taking process, so as to reconstruct the MR image by integrating the prior information and the k-space data together. The "prior" information may also be referred to as "prior knowledge". In this situation, when the calculating unit 126b calculates an intermediate MR image by using prior knowledge and further calculates an MR image serving as a final output by using prior knowledge, the calculating unit 126b may set the strength of the prior knowledge (hereinafter, "prior strength", as necessary) applied to the calculation of the intermediate MR image to be higher than the prior strength applied to the calculation of the MR image serving as the final output. For the "prior" information, for example, "Tsao J. et al., "Unifying Linear Prior-Information-Driven methods for Accelerated Image Acquisition," Mag. Reson. In Med. 46: 652-660, 2001." can be referenced. (In particular, from Table 1. Summary of Reconstruction Methods on page 653, the regularization term called 'Static reference image' is applicable.) A SENSE method that uses regularization can be expressed with the expression shown below, where $\lambda$ denotes the prior strength, $\rho_{alias}$ denotes a folded input image, $\rho$ denotes an estimated MR image, $\rho_{static}$ denotes a static reference MR image (which may be referred to as "prior knowledge" or "determination image"), $\psi$ denotes a noise co-variance matrix, S denotes a sensitivity matrix, and R denotes a matrix used in the regularization.

$$\rho = (S^*\psi^{-1}S + \lambda R^*R)^{-1}(S^*\psi^{-1}\rho_{alias} + \lambda R^*R\rho_{static})$$

The concept and the details of the SENSE method is written in "Pruessmann K. P. et al., "SENSE: Sensitivity Encoding for Fast MRI," Mag. Reson. In Med. 42: 952-962, 1999.". When $\lambda=0$ is satisfied, the expression serves as an expression of a SENSE method that uses no regularization. It is possible to use the prior information and the SENSE method in combination by, for example, adding a prior information term to an equation to be solved by implementing the SENSE method. In that situation, a prior strength is set as a parameter. When the two-stage configuration described in the first embodiment is used, it is possible to inhibit noise from the SENSE method in the data at the intervals A, which is prone to have noise, by, for example, arranging the prior strength at the first stage to be higher than the prior strength at the second stage. Further, for example, it is also acceptable to use $\lambda>0$ in the first stage and to use $\lambda=0$ in the second stage (i.e., to use the prior information only in the first stage).

The usage of the prior information described herein is not particularly limited to the SENSE method. It is also acceptable to use the prior information with a k-t SENSE method. Further, when k-space data are imaged in a time series, it is also acceptable to calculate average k-space data by calculating a time-direction average among the sampled positions at which the data was acquired and to perform a reconstructing process on the average k-space data so that a reconstructed MR image is used as the static reference MR image (see "Tsao J. et al., "k-t BLAST and k-t SENSE: Dynamic MRI With High Frame Rate Exploiting Spatiotemporal Correlations," Mag. Reson. In Med. 50: 1031-1042, 2003.").

Filter

Figure 8:
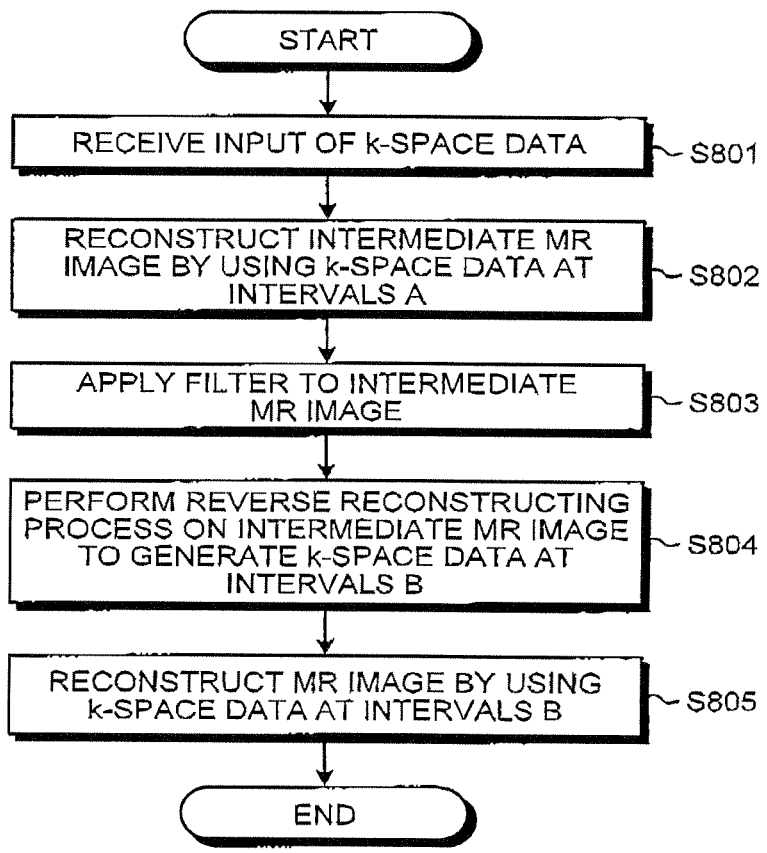
FIG. 8 is a flowchart of a processing procedure according to a modification example of the first embodiment.

An advantage characteristic of the configurations using two or more stages lies in that it is possible to apply an image quality improving operation, such as a non-linear noise eliminating filter, to the output from a previous stage. FIG. 8 is a flowchart of a processing procedure according to a modification example of the first embodiment. For example, the k-space data generating unit 126c is able to perform a filter applying step S803 between a reconstructing process at step S802 and an inverse reconstructing process at step S804.

Examples of the filter used in this situation include an $\epsilon$ filter. The $\epsilon$ filter is a filter used for performing the operation described below while sequentially selecting each of the pixels as a pixel of interest. The $\epsilon$ filter is applicable even to complex number data. First, the k-space data generating unit 126c extracts pixel values in a predetermined area centered on a pixel of interest, with respect to an intermediate MR image reconstructed at step S802. Subsequently, the k-space data generating unit 126c calculates a weighted average of the surrounding pixels by regarding the pixel value of a surrounding pixel as a predetermined value (e.g., the value of the pixel of interest itself) if the difference in the pixel values between the pixel of interest and the surrounding pixel is equal to or larger than a predetermined level and regarding the pixel value of a surrounding pixel as the pixel value thereof if the difference is smaller. When the $\epsilon$ filter is used, it is possible to selectively reduce the noise while keeping the contour, without increasing the processing amount. It should be noted that the filter used in the filter applying step at step S803 does not necessarily have to be an $\epsilon$ filter. It is acceptable to use other filters.

As explained above, according to the first embodiment, it is possible to acquire the k-space data appropriately and it is thus possible to improve the image quality of the MR image.

Second Embodiment

In the first embodiment, the example in which the SENSE method is used as the parallel imaging technique is explained. However, the exemplary embodiments are not limited to this example. For example, the calculating unit 126b may use a SMASH-based GRAPPA method as a parallel imaging technique.

A Reconstructing Process that Uses a GRAPPA Method

To reconstruct an MR image by implementing a GRAPPA method, the acquiring unit 126a acquires k-space data for a central part of the k-space without performing a down-sampling process, so as to obtain training-purpose data in the GRAPPA method, in addition to k-space data at sampled positions corresponding to the intervals A and the intervals B. In this situation, from the k-space data at the intervals B, the k-space data generating unit 126c is able to calculate an interpolation coefficient used for interpolating the k-space data at the intervals A, with the intervals B. Further, the k-space data generating unit 126c estimates k-space data at the intervals B that are at the positions thinned out, by applying the calculated interpolation coefficient to the k-space data at the intervals A. After that, from the training-purpose data, the k-space data generating unit 126c is able to calculate an interpolation coefficient used for interpolating the k-space data at the intervals B. Further, the k-space data generating unit 126c estimates the k-space lines in the rest of the positions, by applying the calculated interpolation coefficient to the k-space data at the intervals B. Thus, the k-space data generating unit 126c is able to estimate all of the k-space lines in the k-space. The training-purpose data acquired without performing a down-sampling process may be referred to as a "sensitivity distribution" or "calibration data".

In other words, the k-space data generating unit 126c estimates the k-space data at the intervals B in correspondence with each of the reception coils (each of the channels) by applying the interpolation coefficient derived from the k-space data acquired in correspondence with each of the reception coils (each of the channels) by performing the down-sampling process at the intervals B, to the k-space data acquired in correspondence with each of the reception coils (each of the channels) by performing the down-sampling process at the intervals A. The (estimated) k-space data at the intervals B is the k-space data in the positions to fill in the k-space lines that were thinned out in the down-sampling process performed at the intervals A. Further, the MR image calculating unit 126d calculates an MR image by estimating all of the k-space lines in the k-space by applying the interpolation coefficient to the k-space data corresponding to each of the reception coils (each of the channels) obtained by combining the estimated k-space data at the intervals B with the actually-acquired k-space data at the intervals B.

When the GRAPPA method is implemented in this manner, the intervals are not arbitrary, but the k-space data generating unit 126c limits the intervals to the two types (e.g., the intervals A and the intervals B). Thus, an advantageous effect is achieved where it is possible to realize a variable-density sampling process only by training as few interpolation coefficient sets as the number of intervals (e.g., two) to which the use is limited.

A multi-stage reconstructing process using the GRAPPA method and the SENSE method It is acceptable to configure the MRI apparatus 100 to reconstruct an image by performing a multi-stage reconstructing process using the GRAPPA method and the SENSE method, so as to first implement the GRAPPA method with larger intervals to calculate k-space lines required to implement the SENSE method with smaller intervals, before performing the reconstructing process by implementing the SENSE method.

Figure 9:
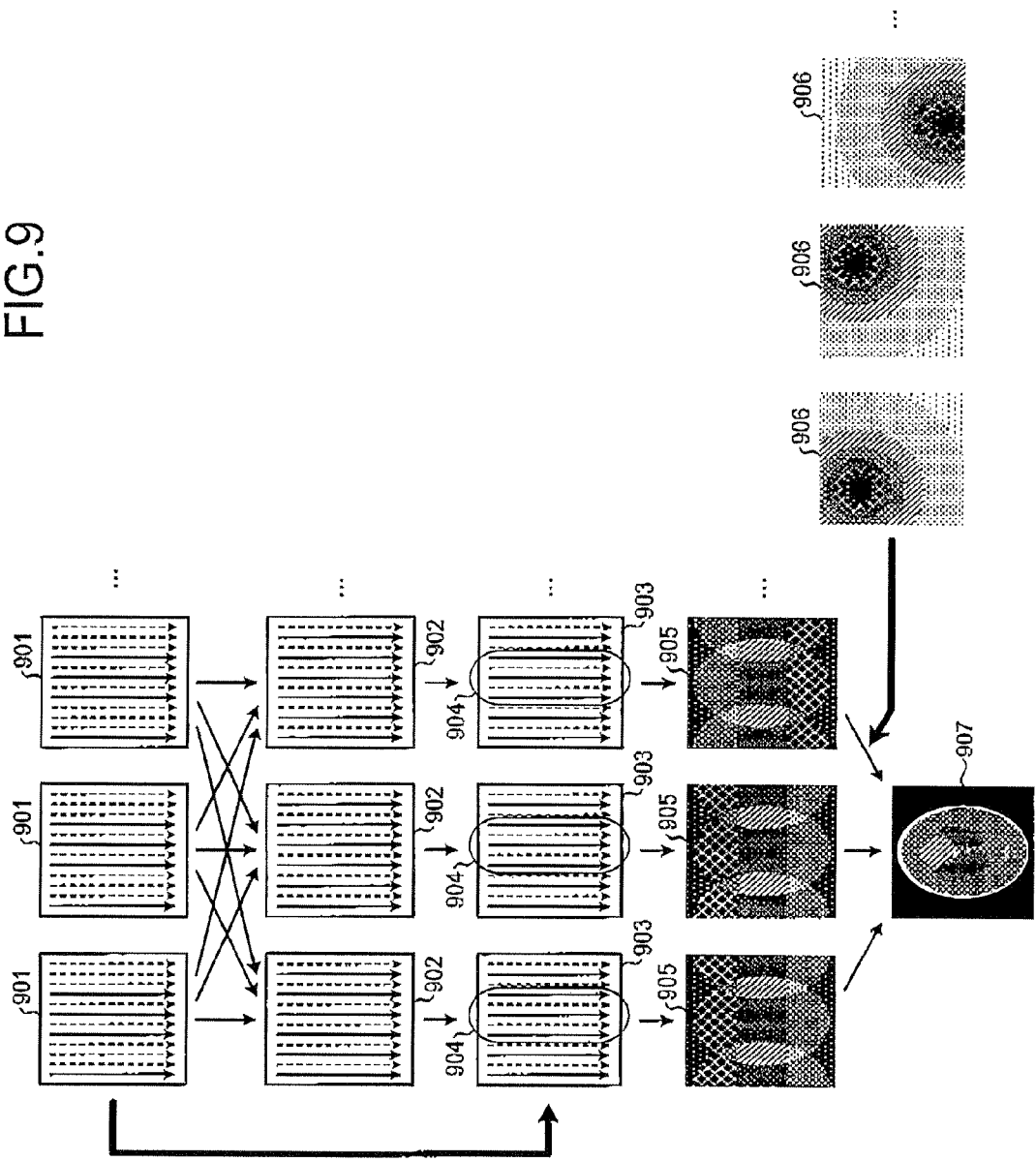
FIG. 9 is a drawing of an MR image calculating process according to a second embodiment.

FIG. 9 is a drawing of an MR image calculating process according to a second embodiment. First, like in the first embodiment, the k-space data generating unit 126c receives an input of k-space data (e.g., pieces of k-space data 901 shown in FIG. 9) acquired by the acquiring unit 126a. Subsequently, the k-space data generating unit 126c generates pieces of (estimated) k-space data 902 at the intervals B in correspondence with the reception coils (the channels), by applying an interpolation coefficient derived from k-space data acquired in correspondence with each of the reception coils (each of the channels) by performing a down-sampling process at the intervals B, to k-space data acquired in correspondence with each of the reception coils (each of the channels) by performing a down-sampling process at the intervals A. The pieces of (estimated) k-space data 902 at the intervals B are pieces of k-space data in the positions to fill in the k-space lines that were thinned out in the down-sampling process performed at the intervals A.

The processes performed thereafter are the same as those in the first embodiment. The MR image calculating unit 126d generates pieces of k-space data 903 at the intervals B corresponding to the reception coils (the channels), by combining the (estimated) pieces of k-space data 902 at the intervals 3 generated by the k-space data generating unit 126c in correspondence with the reception coils (the channels), with pieces of k-space data at the intervals B that are among the pieces of k-space data 901 actually acquired by the acquiring unit 126a. In FIG. 9, the pieces of k-space data at the intervals B that were actually acquired and are combined with the pieces of k-space data 902 at the intervals B are the k-space lines shown with solid lines in the central parts marked with ovals 904. After that, the MR image calculating unit 126d obtains folded images 905 by performing a reconstructing process on each of the pieces of k-space data 903 at the intervals B. Subsequently, the MR image calculating unit 126d calculates an MR image 907 serving as the final output by performing an unfolding process according to the parallel imaging technique, by applying sensitivity distributions 906 corresponding to the reception coils (the channels) to the folded images 905, respectively.

Other Embodiments

The exemplary embodiments are not limited to the first and the second embodiments described above.

In the exemplary embodiments described above, it is assumed that, for example, the acquiring unit 126a acquires the k-space data in correspondence with each of the reception coils (each of the channels) by regularly employing the down-sampling process performed at the first interval and the down-sampling process performed at the second interval larger than the first interval. However, the exemplary embodiments are not limited to this example. In other words, the exemplary embodiments are not limited by how the k-space data are acquired. Any other configuration is acceptable as long as "k-space data that is arranged in a first region so as to be positioned at the first interval and arranged in a second region larger than the first region so as to be positioned at the second interval larger than the first interval" is present. In other words, although the exemplary embodiments described above and below are explained on the assumption that the data are "acquired", the exemplary embodiments are not limited by how the data are acquired. Any other configuration is acceptable as long as k-space data are present that is arranged in the k-space in a predetermined positional arrangement pattern.

In that situation, it is possible to interpret FIGS. 3 and 4 as drawings showing examples of the positional arrangement pattern (which may be referred to as a "sampling pattern") of the k-space data. For example, a positional arrangement pattern 301 shown in FIG. 3 is an arrangement pattern (in a two-dimensional k-space) obtained when the first interval=2 and the second interval=4 are satisfied. All of the k-space lines 304 positioned at the second interval (=4) serve as targets of the positional arrangement. In contrast, of the k-space lines 302 and 303 positioned at the first interval, although the k-space line 302 positioned closer to the central part of the k-space serves as a target of the positional arrangement, the k-space line 303 positioned in the peripheral part of the k-space does not serve as a target of the positional arrangement.

For example, in the example explained in the first embodiment, the acquiring unit 126a arranges the NMR data that is acquired by implementing the parallel imaging and corresponds to the plurality of channels into the first region of the k-space within the storage unit 123 so as to be positioned at the first interval and into the second region larger than the first region so as to be positioned at the second interval larger than the first interval. For example, the acquiring unit 126a arranges the NMR data into the first region corresponding to the central part of the k-space so as to be positioned at the first interval and into the second region that is larger and includes the peripheral part of the k-space so as to be positioned at the second interval. The k-space data generating unit 126c reconstructs a first group of folded images (e.g., 702 in FIG. 7) corresponding to the plurality of channels from the k-space data at the second interval. Further, the k-space data generating unit 126c reconstructs an intermediate magnetic resonance image (e.g., 704 in FIG. 7) by applying the sensitivity distributions (e.g., 703 in FIG. 7) corresponding to the plurality of channels to the first group of folded images. After that, the k-space data generating unit 126c generates the k-space data (e.g., 705 in FIG. 7) at the first interval corresponding to the plurality of channels by performing the reverse reconstructing process on the intermediate magnetic resonance image based on the sensitivity distributions (e.g., 703 in FIG. 7) corresponding to the plurality of channels. The MR image calculating unit 126d reconstructs a second group of folded images (e.g., 708 in FIG. 7) corresponding to the plurality of channels from at least a part of the k-space data at the first interval arranged in the first region and the k-space data at the first interval generated based on the k-space data at the second interval. Further, the MR image calculating unit 126d reconstructs the magnetic resonance image (e.g., 709 in FIG. 7) by applying the sensitivity distributions (e.g., 703 in FIG. 7) corresponding to the plurality of channels to the second group of folded images.

In the example explained in the second embodiment (the reconstructing process using the GRAPPA method), the acquiring unit 126a arranges the NMR data that is acquired by implementing the parallel imaging and corresponds to the plurality of channels into the first region of the k-space within the storage unit 123 so as to be positioned at the first interval and into the second region larger than the first region so as to be positioned at the second interval larger than the first interval. For example, the acquiring unit 126a arranges the NMR data into the first region corresponding to the central part of the k-space so as to be positioned at the first interval and into the second region that is larger and includes the peripheral part of the k-space so as to be positioned at the second interval. The k-space data generating unit 126c generates the k-space data at the first interval corresponding to the plurality of channels by applying the interpolation coefficient derived from the k-space data at the first interval to the k-space data at the second interval. The MR image calculating unit 126d reconstructs the magnetic resonance image by applying the interpolation coefficient derived from the sensitivity distributions to at least a part of the k-space data at the first interval arranged in the first region and the k-space data at the first interval generated based on the k-space data at the second interval.

In the example explained in the second embodiment (the multi-stage reconstructing process using the GRAPPA method and the SENSE method), the acquiring unit 126a arranges the NMR data that is acquired by implementing the parallel imaging and corresponds to the plurality of channels into the first region of the k-space within the storage unit 123 so as to be positioned at the first interval and into the second region larger than the first region so as to be positioned at the second interval larger than the first interval. For example, the acquiring unit 126a arranges the NMR data into the first region corresponding to the central part of the k-space so as to be positioned at the first interval and into the second region that is larger and includes the peripheral part of the k-space so as to be positioned at the second interval. The k-space data generating unit 126c generates the k-space data (e.g., 902 in FIG. 9) at the first interval corresponding to the plurality of channels by applying the interpolation coefficient derived from the k-space data at the first interval to the k-space data at the second interval. The MR image calculating unit 126d reconstructs a second group of folded images (e.g., 905 in FIG. 9) corresponding to the plurality of channels from at least a part of the k-space data at the first interval arranged in the first region and the k-space data at the first interval generated based on the k-space data at the second interval. Further, the MR image calculating unit 126d reconstructs the magnetic resonance image (e.g., 907 in FIG. 9) by applying the sensitivity distributions (e.g., 906 in FIG. 9) corresponding to the plurality of channels to the second group of folded images.

The timing with which the k-space data are arranged into the first region of the k-space so as to be positioned at the first interval and the timing with which the k-space data are arranged into the second region so as to be positioned at the second interval do not have to be the same. For example, it is acceptable if, in the k-space at a certain stage, the k-space data are arranged in the second region thereof so as to be positioned at the second interval. In other words, at that stage, it is acceptable even if no k-space data positioned at the first interval is arranged in the first region of the k-space. For example, the k-space data generating unit 126c is able to, at that stage, perform the process of generating the k-space data at the first interval from the k-space data at the second interval. The process to arrange the k-space data into the first region so as to be positioned at the first interval may be performed before and after the process performed by the k-space data generating unit 126c or may be performed in parallel. If the process is performed in parallel, it is possible to shorten the entire processing time period from the arranging process to the MR image reconstructing process. Further, the exemplary embodiments include a situation where the k-space in which the k-space data are arranged so as to be positioned at the first interval and the k-space in which the k-space data are arranged so as to be positioned at the second interval are not mutually the same k-space.

Sampling Time-Series Data

In the exemplary embodiments above, the example is explained in which the two-dimensional or three-dimensional k-space data that is not in time series is acquired; however, the exemplary embodiments are not limited to this example. The MRI apparatus 100 according to the exemplary embodiments is able to perform the various types of processes described above, even when k-space data (hereinafter, "time-series data" as necessary) in a predetermined number of frames that are sequential in a time series is acquired. For example, when acquiring such time-series data, the acquiring unit 126a acquires the k-space data by regularly employing the down-sampling process performed at the intervals A and the down-sampling process performed at the intervals B in the phase encoding direction and also acquires the k-space data by regularly employing the down-sampling process performed at the intervals A and the down-sampling process performed at the intervals B also in the time direction. Further, when acquiring such time-series data, the acquiring unit 126a changes the positions of the k-space lines that are acquired without being thinned out, for each of the frames.

Figure 10:
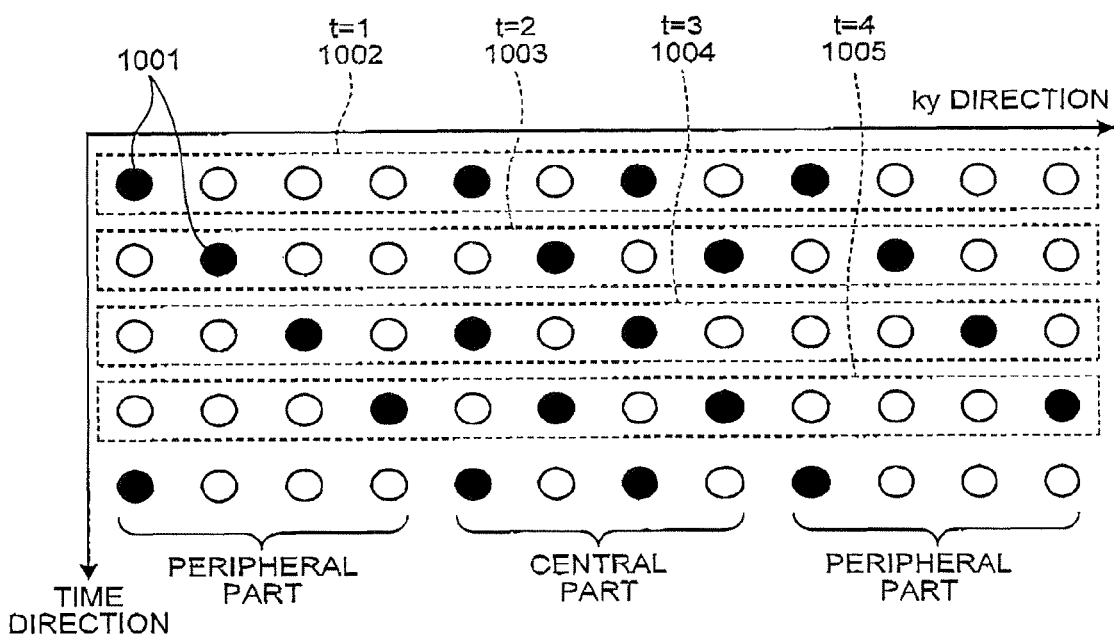
FIG. 10 is a drawing of sampling intervals for k-space data according to another embodiment.

FIG. 10 is a drawing of sampling intervals for k-space data according to another embodiment and illustrates, for example, an example of sampled positions used when the k-t SENSE method is implemented. FIG. 10 illustrates only the ky direction (the phase encoding direction) and the time direction and does not show the kx direction (the frequency encoding direction). For this reason, each of the dots corresponds to "one" k-space line. Each of the black dots represents a sampled position 1001 that is acquired without being thinned out, whereas boxes 1002 to 1005 drawn with dotted lines represent pieces of k-space data acquired at times t=1 to 4, respectively. As for the k-t SENSE method, see "Tsao J. et al., "k-t BLAST and k-t SENSE: Dynamic MRI With High Frame Rate Exploiting Spatiotemporal Correlations," Mag. Reson. In Med. 50: 1031-1042, 2003."

In the example shown in FIG. 10, the acquiring unit 126a determines the sampled positions in the phase encoding direction while using the intervals A=4 (the four-sample intervals) and the intervals B=2 (the two-sample intervals) at each of the times t. Further, the acquiring unit 126a sequentially changes the sampled positions, in four-period cycles (once per four time units) for the part (the peripheral part of the k-space) where the acquisition is performed at the four-sample intervals and in two-period cycles (once per two time units) for the part (the central part of the k-space) where the acquisition is performed at the two-sample intervals. In other words, the acquiring unit 126a acquires the k-space data by regularly employing the down-sampling process performed at the intervals A and the down-sampling process performed at the intervals B, also in the time direction. Because the acquiring unit 126a is able to maintain the cyclic sampled positions in the time direction in this manner with respect to both the sampling intervals A and the sampling intervals B, it is possible to implement the k-t SENSE method without any alteration.

Further, the direction in which the k-space data are filled in does not necessarily have to be from the left to the right, as shown in FIG. 10. It is, for example, acceptable to fill in the data from the right to the left. More commonly, when each of the pieces of k-space data at different times is referred to as a "frame", the acquiring unit 126a may determine the sampled positions in such a manner that, when the sampled positions corresponding to as many consecutive frames as A that are sequential in the time series are superimposed, the sampled positions coincide with all the sampled positions in the k-space. As explained here, the acquiring unit 126a acquires the k-space data while changing the sampled positions in the phase encoding direction along the time series.

Other Configurations

In the exemplary embodiments described above, the example is explained in which the MRI apparatus 100 serving as a medical image diagnosis apparatus performs the various types of processes; however, the exemplary embodiments are not limited to this example. For example, another arrangement is acceptable in which, instead of the MRI apparatus 100, an image processing apparatus or an image processing system including the MRI apparatus 100 and an image processing apparatus performs the various types of processes described above. In this situation, the image processing apparatus may be, for example, a workstation, an image storing apparatus (an image server) and a viewer used in a Picture Archiving and Communication System (PACS), or various types of apparatuses used in an electronic medical record system. In that situation, for example, the image processing apparatus receives the k-space data acquired by the MRI apparatus 100 from the MRI apparatus 100 or from the image server via a network or from an input made by the operator via a recording medium and stores the received k-space data into a storage unit. Further, the image processing apparatus performs the various types of processes described above (e.g., the process performed by the calculating unit 126b) while using the k-space data stored in the storage unit as the processing target. Furthermore, in the exemplary embodiments described above, the example is explained in which the MR image is displayed on the display unit 125; however, the exemplary embodiments are not limited to this example. It is acceptable to configure the MRI apparatus 100 so as to end the process by outputting the image data to the storage unit 123, for example, after calculating the MR image, without having the MR image displayed. In that situation, for example, the MR image calculated by the MRI apparatus 100 or the image processing apparatus is used by other apparatuses and the like.

Computer Programs

The instructions indicated in the processing procedures described in the exemplary embodiments above may be executed based on a computer program (hereinafter, "the program") realized with software. By configuring a general-purpose computer system so as to store therein the program in advance and to read the stored program, it is also possible to achieve the same advantageous effects as those with the MRI apparatus or the image processing apparatus described in the exemplary embodiments above. The instructions described in the exemplary embodiments above are recorded, as a computer-executable program, into a recording medium such as a magnetic disk (a flexible disk, a hard disk, or the like), an optical disk (a Compact Disk Read-Only Memory (CD-ROM), a Compact Disk Recordable (CD-R), a Compact Disk Rewritable (CD-RW), a Digital Versatile Disk Read-Only Memory (DVD-ROM), a Digital Versatile Disk Recordable (DVD±R), a Digital Versatile Disk Rewritable (DVD±RW) or the like), a semiconductor memory, or the like. As long as the computer or an incorporated system is able to read data from the storage medium, any storing format is acceptable. When the computer reads the program from the recording medium and causes the CPU to execute the instructions written in the program based on the program, it is possible to realize the same operations as those performed by the MRI apparatus or the image processing apparatus described in the exemplary embodiments above. Needless to say, when the computer obtains or reads the program, the computer may obtain or read the program via a network.

Further, another arrangement is also acceptable in which, based on the instructions written in the program installed from the storage medium onto a computer or an incorporated system, an Operating System (OS) running in the computer, database managing software, middleware for a network, or the like executes a part of the processes used for realizing the exemplary embodiments described above.

Further, the storage medium does not necessarily have to be a medium that is independent of the computer or the incorporated system. Examples of the storage medium include such a storage medium that has stored therein or has temporarily stored therein the downloaded computer program transmitted via a Local Area Network (LAN), the Internet, or the like.

Further, more than one storage medium may be used. As an example of the storage medium described in the exemplary embodiments, the processes in the exemplary embodiments may be executed from a plurality of media. Any configuration is acceptable as the configuration of the medium/media.

The computer or the incorporated system according to the exemplary embodiments is configured to perform the processes described in the exemplary embodiments above based on the program stored in the storage medium. The computer or the incorporated system may be configured with a single apparatus such as a personal computer, a microcomputer, or the like or may be configured with a system in which a plurality of apparatuses are connected together via a network.

The computer in the exemplary embodiments does not necessarily have to be a personal computer and may be an arithmetic processing unit included in an information processing apparatus, a microcomputer, or the like. The term "computer" is used to generally refer to all the devices and apparatuses that are able to realize the functions described in the exemplary embodiments, based on the program.

By using the magnetic resonance imaging apparatus and the apparatus, the system, and the method for image processing according to at least one aspect of the exemplary embodiments described above, it is possible to acquire the k-space data appropriately.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic resonance imaging apparatus comprising:
an arranging unit configured to arrange magnetic resonance signals acquired by implementing parallel imaging and correspond to a plurality of channels into a first region on a k-space so as to be positioned at first interval to generate first k-space data and into a second region larger than the first region so as to be positioned at second interval larger than the first interval to generate second k-space data;
a generating unit configured to generate third k-space data of the first interval corresponding to each of the plurality of channels, based on the second k-space data; and
a reconstructing unit configured to reconstruct a magnetic resonance image, based on the first k-space data, the third k-space data, and sensitivity distributions corresponding to the plurality of channels.

2. The apparatus according to claim 1, wherein the arranging unit arranges the magnetic resonance signals into the first region corresponding to a central part of the k-space so as to be positioned at the first interval and into the second region that is larger and includes a peripheral part of the k-space so as to be positioned at the second interval.

3. The apparatus according to claim 2, wherein the generating unit reconstructs an intermediate magnetic resonance image based on the second k-space data and generates the third k-space data corresponding to each of the plurality of channels by performing an inverse reconstructing process on the intermediate magnetic resonance image based on the sensitivity distributions corresponding to the plurality of channels.

4. The apparatus according to claim 2, wherein
the generating unit reconstructs a first group of folded images corresponding to the plurality of channels from the second k-space data, reconstructs an intermediate magnetic resonance image by applying the sensitivity distributions corresponding to the plurality of channels to the first group of folded images, and generates the third k-space data corresponding to each of the plurality of channels by performing an inverse reconstructing process on the intermediate magnetic resonance image based on the sensitivity distributions corresponding to the plurality of channels, and
the reconstructing unit reconstructs a second group of folded images corresponding to the plurality of channels from at least a part of the first k-space data and the third k-space data and further reconstructs the magnetic resonance image by applying the sensitivity distributions corresponding to the plurality of channels to the second group of folded images.

5. The apparatus according to claim 2, wherein
the generating unit generates the third k-space data corresponding to each of the plurality of channels by applying an interpolation coefficient derived from the first k-space data to the second k-space data, and
the reconstructing unit reconstructs the magnetic resonance image by applying an interpolation coefficient derived from the sensitivity distributions to at least a part of the first k-space data and the third k-space data.

6. The apparatus according to claim 2, wherein
the generating unit generates the third k-space data corresponding to each of the plurality of channels by applying an interpolation coefficient derived from the first k-space data to the second k-space data, and
the reconstructing unit reconstructs a second group of folded images corresponding to the plurality of channels from at least a part of the first k-space data and the third k-space data and further reconstructs the magnetic resonance image by applying the sensitivity distributions corresponding to the plurality of channels to the second group of folded images.

7. The apparatus according to claim 1, wherein the arranging unit arranges the magnetic resonance signals into the k-space so that the second interval are each an integer multiple of the first interval.

8. The apparatus according to claim 2, wherein the arranging unit arranges magnetic resonance signals corresponding to a predetermined number of frames that are sequential in a time series so as to be positioned at the first interval and at the second interval also in a time direction.

9. The apparatus according to claim 2, wherein, when arranging, into a k-space, magnetic resonance signals corresponding to a predetermined number of frames that are sequential in a time series, the arranging unit arranges the magnetic resonance signals in such a manner that positions where the k-space data are arranged and positions where the k-space data are not arranged are different for each of the frames.

10. The apparatus according to claim 1, wherein the generating unit reconstructs an intermediate magnetic resonance image based on the second k-space data and generates the third k-space data corresponding to each of the plurality of channels by performing an inverse reconstructing process on the intermediate magnetic resonance image based on the sensitivity distributions corresponding to the plurality of channels.

11. The apparatus according to claim 10, wherein when the intermediate magnetic resonance image is reconstructed by the generating unit by using prior knowledge, whereas the magnetic resonance image is reconstructed by the reconstructing unit by using prior knowledge, a strength of the prior knowledge applied to the reconstruction of the intermediate magnetic resonance image is set to be higher than a strength of the prior knowledge applied to the reconstruction of the magnetic resonance image.

12. The apparatus according to claim 1, wherein
the generating unit reconstructs a first group of folded images corresponding to the plurality of channels from the second k-space data, reconstructs an intermediate magnetic resonance image by applying the sensitivity distributions corresponding to the plurality of channels to the first group of folded images, and generates the third k-space data corresponding to each of the plurality of channels by performing an inverse reconstructing process on the intermediate magnetic resonance image based on the sensitivity distributions corresponding to the plurality of channels, and
the reconstructing unit reconstructs a second group of folded images corresponding to the plurality of channels from at least a part of the first k-space data and the third k-space data and further reconstructs the magnetic resonance image by applying the sensitivity distributions corresponding to the plurality of channels to the second group of folded images.

13. The apparatus according to claim 12, wherein when the intermediate magnetic resonance image is reconstructed by the generating unit by using prior knowledge, whereas the magnetic resonance image is reconstructed by the reconstructing unit by using prior knowledge, a strength of the prior knowledge applied to the reconstruction of the intermediate magnetic resonance image is set to be higher than a strength of the prior knowledge applied to the reconstruction of the magnetic resonance image.

14. The apparatus according to claim 1, wherein
the generating unit generates the third k-space data corresponding to each of the plurality of channels by applying an interpolation coefficient derived from the first k-space data to the second k-space data, and
the reconstructing unit reconstructs the magnetic resonance image by applying an interpolation coefficient derived from the sensitivity distributions to at least a part of the first k-space data and the third k-space data.

15. The apparatus according to claim 1, wherein
the generating unit generates the third k-space data corresponding to each of the plurality of channels by applying an interpolation coefficient derived from the first k-space data to the second k-space data, and
the reconstructing unit reconstructs a second group of folded images corresponding to the plurality of channels from at least a part of the first k-space data and the third k-space data and further reconstructs the magnetic resonance image by applying the sensitivity distributions corresponding to the plurality of channels to the second group of folded images.

16. The apparatus according to claim 1, wherein the arranging unit arranges the magnetic resonance signals into the k-space so that the second interval are each an integer multiple of the first interval.

17. The apparatus according to claim 1, wherein the arranging unit arranges magnetic resonance signals corresponding to a predetermined number of frames that are sequential in a time series so as to be positioned at the first interval and at the second interval also in a time direction.

18. The apparatus according to claim 1, wherein, when arranging, into a k-space, magnetic resonance signals corresponding to a predetermined number of frames that are sequential in a time series, the arranging unit arranges the magnetic resonance signals in such a manner that positions where the k-space data are arranged and positions where the k-space data are not arranged are different for each of the frames.

19. An image processing apparatus comprising:
a storage unit configured to store therein k-space data obtained by arranging magnetic resonance signals acquired by implementing parallel imaging and correspond to a plurality of channels into a first region on a k-space so as to be positioned at first interval to generate first k-space data and into a second region larger than the first region so as to be positioned at second interval larger than the first interval to generate second k-space data;
a generating unit configured to generate third k-space data of the first interval corresponding to each of the plurality of channels, based on the second k-space data; and
a reconstructing unit configured to reconstruct a magnetic resonance image, based on the first k-space data, the third k-space data, and sensitivity distributions corresponding to the plurality of channels.

20. A magnetic resonance imaging apparatus comprising:
a memory storing therein k-space data; and
a processor,
the processor including
an arranging unit configured to arrange magnetic resonance signals that are acquired by implementing parallel imaging and correspond to a plurality of channels into a first region on a k-space so as to be positioned at first interval to generate first k-space data and into a second region larger than the first region so as to be positioned at second interval larger than the first interval to generate second k-space data;
a generating unit configured to reconstruct a first group of folded images corresponding to the plurality of channels from the second k-space data, reconstructs an intermediate magnetic resonance image by applying the sensitivity distributions corresponding to the plurality of channels to the first group of folded images, and generates third k-space data at the first interval corresponding to each of the plurality of channels by performing an inverse reconstructing process on the intermediate magnetic resonance image based on the sensitivity distributions corresponding to the plurality of channels; and
a reconstructing unit configured to reconstruct a second group of folded images corresponding to the plurality of channels from at least a part of the first k-space data and the third k-space data and further reconstructs the magnetic resonance image by applying the sensitivity distributions corresponding to the plurality of channels to the second group of folded images.

* * * * *